United States Patent
Toyoizumi et al.

(10) Patent No.: US 11,169,220 B2
(45) Date of Patent: Nov. 9, 2021

(54) DETERIORATION DEGREE DIAGNOSIS DEVICE AND DETERIORATION DEGREE DIAGNOSIS METHOD FOR ELECTRICAL CONNECTION PORTION

(71) Applicants: YAZAKI CORPORATION, Tokyo (JP); NATIONAL INSTITUTE OF ADVANCED INDUSTRIAL SCIENCE AND TECHNOLOGY, Tokyo (JP)

(72) Inventors: Jun Toyoizumi, Makinohara (JP); Yoshitaka Ito, Makinohara (JP); Takaya Kondo, Makinohara (JP); Yasuhiro Fukuyama, Tsukuba (JP); Nobuhisa Kaneko, Tsukuba (JP)

(73) Assignees: YAZAKI CORPORATION, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 256 days.

(21) Appl. No.: 16/434,302

(22) Filed: Jun. 7, 2019

(65) Prior Publication Data

US 2020/0003814 A1 Jan. 2, 2020

(30) Foreign Application Priority Data

Jun. 27, 2018 (JP) .............................. JP2018-121874

(51) Int. Cl.
*G01R 31/68* (2020.01)
*G01R 27/14* (2006.01)
(Continued)

(52) U.S. Cl.
CPC .............. *G01R 31/68* (2020.01); *G01R 27/14* (2013.01); *G01R 31/14* (2013.01); *G01R 31/42* (2013.01);
(Continued)

(58) Field of Classification Search
CPC ........ G01R 27/14; G01R 27/02; G01R 27/16; G01R 27/18; G01R 31/68; G01R 31/50;
(Continued)

(56) References Cited

U.S. PATENT DOCUMENTS

2009/0085585 A1 4/2009 Lu et al.
2009/0243623 A1* 10/2009 Jones ................... G01R 31/088
324/521
(Continued)

FOREIGN PATENT DOCUMENTS

CN 101398369 A 4/2009
CN 107615053 A 1/2018
(Continued)

OTHER PUBLICATIONS

"Chapter VI Experimental Study on the Influence of the Surface Pollution on Contacting Member Properties", May 2011, pp. 82-90 (8 pages total).

*Primary Examiner* — Amy He
(74) *Attorney, Agent, or Firm* — Sughrue Mion, PLLC

(57) ABSTRACT

A deterioration degree diagnosis device includes a measurement unit and a diagnosis unit. The measurement unit measures an impedance related to a contact resistance of an electrical connection portion by measuring an AC voltage between metal members and an AC current flowing between the metal members in a state where an AC signal of a predetermined frequency is applied to an electric circuit that connects two metal members in contact via the electrical connection portion. The diagnosis unit diagnoses a deterio-
(Continued)

ration degree of the electrical connection portion based on a reactance component value in the impedance measured by the measurement unit.

5 Claims, 14 Drawing Sheets

(51) Int. Cl.
    *G01R 31/42*     (2006.01)
    *G01R 31/14*     (2006.01)
    *H01H 1/58*     (2006.01)
    *G01R 31/50*     (2020.01)
    *G01R 31/66*     (2020.01)

(52) U.S. Cl.
    CPC ............. *G01R 31/50* (2020.01); *G01R 31/66* (2020.01); *H01H 1/58* (2013.01)

(58) Field of Classification Search
    CPC ........ G01R 31/42; G01R 31/14; G01R 31/66; H02H 11/001; H02H 5/105; H01H 1/58
    See application file for complete search history.

(56) References Cited

U.S. PATENT DOCUMENTS

| | | |
|---|---|---|
| 2010/0013498 A1* | 1/2010 | Olguin ................. H02H 11/001 324/649 |
| 2013/0096853 A1 | 4/2013 | Mahalingam et al. |
| 2015/0235780 A1 | 8/2015 | Koepsell |
| 2015/0235783 A1 | 8/2015 | Koepsell |
| 2015/0235785 A1 | 8/2015 | Koepsell |
| 2018/0292344 A1 | 10/2018 | Kamihara et al. |

FOREIGN PATENT DOCUMENTS

| | | |
|---|---|---|
| JP | 6-325651 A | 11/1994 |
| JP | 11-39976 A | 2/1999 |
| JP | 2002-277494 A | 9/2002 |
| JP | 2013-89596 A | 5/2013 |
| JP | 2015-179665 A | 10/2015 |

* cited by examiner

DETERIORATION DEGREE DIAGNOSIS DEVICE AND DETERIORATION DEGREE DIAGNOSIS METHOD FOR ELECTRICAL CONNECTION PORTION

CROSS-REFERENCE TO RELATED APPLICATIONS

This application is based on and claims priority under 35 USC 119 from Japanese Patent Application No. 2018-121874 filed on Jun. 27, 2018, the contents of which are incorporated herein by reference.

TECHNICAL FIELD

The present invention relates to a deterioration degree diagnosis device and a deterioration degree diagnosis method for an electrical connection portion.

BACKGROUND ART

In general, in a structure in which two metal members are electrically connected via an electrical connection portion, for example, a male terminal and a female terminal of a connector, it is known that a contact resistance of the electrical connection portion increases due to aged deterioration caused by an oxidation reaction in a vicinity of the electrical connection portion. When the aged deterioration progresses excessively, the electrical connection portion reaches an insulation state, so that a conduction failure may occur between the two metal members. Accordingly, it is important to establish a technique for diagnosing a deterioration degree of an electrical connection portion.

For example, Patent Document 1 discloses a method for diagnosing a deterioration degree of an electrical connection portion between two metal members. In this document, a contact resistance of the electrical connection portion is measured using a DC signal and data of the measured resistance value is accumulated in time series, so that a deterioration degree of the electrical connection portion is diagnosed based on the accumulated time-series data.

Patent Document 1: JP-A-2002-277494

SUMMARY OF INVENTION

A male terminal and a female terminal of a connector are usually shaped by a predetermined pressing, bending or the like of a plate-shape base material made of a base metal which is a copper alloy or the like, and are often formed by performing base metal plating which is tin plating or the like on a surface of the shaped base metal base material.

As described above, in a structure in which two metal members made of a base metal base material plated with a base metal are electrically connected via an electrical connection portion, a contact resistance of the electrical connection portion (more specifically, an electrical resistance value measured using a DC signal) generally increases with passage of time (and accordingly, with progress of an oxidation reaction in a vicinity of the electrical connection portion), while an increase tendency thereof is not monotonic increase (details are described later). Therefore, it is difficult to accurately diagnose the deterioration degree of the electrical connection portion based on the contact resistance value of the electrical connection portion. As described above, for example, even in the structure in which two metal members made of a base metal base material plated with a base metal are electrically connected via an electrical connection portion, it is desired to accurately diagnose a deterioration degree of the electrical connection portion.

The present invention is made in view of the above circumstances, and an object of the present invention is to provide a deterioration degree diagnosis device and a deterioration degree diagnosis method for an electrical connection portion, which are capable of accurately diagnosing a deterioration degree of an electrical connection portion between two metal members.

In order to achieve the above object, the deterioration degree diagnosis device for the electrical connection portion according to the present invention is characterized by the following structures (1) to (4).

(1) A deterioration degree diagnosis device which diagnoses a deterioration degree of an electrical connection portion between two metal members, the deterioration degree diagnosis device includes:
a measurement unit that is configured to measure an impedance related to a contact resistance of the electrical connection portion by measuring an AC voltage between metal members and an AC current flowing between the metal members in a state where an AC signal of a predetermined frequency is applied to an electric circuit that connects two metal members in contact via the electrical connection portion; and
a diagnosis unit that is configured to diagnose a deterioration degree of the electrical connection portion based on a reactance component value in the impedance measured by the measurement unit.

(2) In the deterioration degree diagnosis device according to the above structure (1),
the diagnosis unit stores, as an initial value, the reactance component value in the impedance measured in advance by the measurement unit for the two new metal members, and
the diagnosis unit is configured to diagnose the deterioration degree of the electrical connection portion such that the deterioration degree of the electrical connection portion increases as a deviation of the reactance component value from the initial value increases.

(3) In the deterioration degree diagnosis device according to the above structure (1) or (2),
the metal member is formed of a plated metal base material.

(4) In the deterioration degree diagnosis device for an electrical connection portion according to any one of the structures (1) to (3),
the predetermined frequency is 500 kHz to 2 MHz.

According to the study of the inventor of the present invention, the inventor has found that the reactance component (imaginary component) value in the impedance (complex number) related to the contact resistance of the electrical connection portion measured using the AC signal of the predetermined frequency has a strong correlation with the deterioration degree of the electrical connection portion (details are described later). Therefore, according to the deterioration degree diagnosis device according to the above structure (1), it is possible to accurately diagnose the deterioration degree of the electrical connection portion between the two metal members based on the correlation and the reactance component value.

Specifically, the inventor of the present invention has found that, as the correlation, the reactance component value gradually separates (therefore, the deviation of the reactance component value from the initial value monotonously increases) in one direction (more specifically, in a negative direction) from the initial value (value when the metal member is new) as the deterioration degree of the electrical connection portion progresses from zero (the metal member is new).

A reason is considered to be a fact that a degree, to which electrostatic capacitance due to the metal oxide having a high dielectric constant generated in the vicinity of the electrical connection portion is added in the vicinity of the electrical connection portion, monotonically increases with the progress of the oxidation reaction in the vicinity of the electrical connection portion so that the reactance component (more specifically, the capacitive reactance component) changes in one direction. That is, it is considered that the reactance component value can accurately represent the structural change degree (degree to which the electrostatic capacitance due to the metal oxide is added) in the vicinity of the electrical connection portion with the progress of the deterioration degree of the electrical connection portion.

As described above, according to the deterioration degree diagnosis device according to the above structure (2), the deterioration degree of the electrical connection portion between the two metal members can be accurately diagnosed since the deterioration degree of the electrical connection portion is diagnosed such that the deterioration degree of the electrical connection portion increases as the deviation of the reactance component value from the initial value increases.

The present inventor of the present invention has found that, as the deterioration degree diagnosis device according to the above structure (3), the deviation of the reactance component value from the initial value monotonously increases as the deterioration degree of the electrical connection portion progresses from zero even when the metal member is formed of a plated metal base material. A reason is considered to be a fact that, a degree, to which electrostatic capacitance of oxide of each of the plating and the metal base material is added in the vicinity of the electrical connection portion, monotonically increases with the progress of the oxidation reaction in the vicinity of the electrical connection portion even when the metal member is formed of the plated metal base material. Therefore, according to the deterioration degree diagnosis device according to the above structure (3), the deterioration degree of the electrical connection portion between the two metal members can be accurately diagnosed even when the metal member is formed of the plated metal base material.

The inventor of the present invention has found that, an increase gradient of the "deviation of the reactance component value from the initial value", which increases as the deterioration degree of the electrical connection portion increases from zero, is larger as the frequency of the AC signal applied to the electric circuit increases. Accordingly, for example, as the deterioration degree diagnosis device according to the above structure (4), when a sufficiently large frequency of 500 kHz to 2 MHz is adopted as the frequency of the AC signal applied to the electric circuit, the increase gradient of the "deviation of the reactance component value from the initial value" with the progress of the deterioration degree of the electrical connection portion becomes sufficiently large. Therefore, it is possible to use a device with a sufficiently large measurement range (in other words, the device that is less likely to be affected by noise) as the impedance measurement device. In other words, even in an environment where noise is relatively large, the reactance component value can be accurately measured, and thus the deterioration degree of the electrical connection portion can be accurately diagnosed.

In order to achieve the above object, the deterioration degree diagnosis method for the electrical connection portion according to the present invention is characterized by the following structure (5).

(5) A deterioration degree diagnosis method which diagnoses a deterioration degree of an electrical connection portion between two metal members, the deterioration degree diagnosis method includes:

a measurement step of measuring an impedance related to a contact resistance of the electrical connection portion by measuring an AC voltage between metal members and an AC current flowing between the metal members in a state where an AC signal of a predetermined frequency is applied to an electric circuit that connects two metal members in contact via the electrical connection portion; and a diagnosis step of diagnosing a deterioration degree of the electrical connection portion based on a reactance component value in the impedance measured by the measurement step.

According to the study of the inventor of the present invention, the inventor has found that the reactance component (imaginary component) value in the impedance (complex number) related to the contact resistance of the electrical connection portion measured using the AC signal of the predetermined frequency has a strong correlation with the deterioration degree of the electrical connection portion (details are described later). Therefore, according to the deterioration degree diagnosis method according to the above structure (5), it is possible to accurately diagnose the deterioration degree of the electrical connection portion between the two metal members based on the correlation and the reactance component value.

According to the present invention, it is possible to provide a deterioration degree diagnosis device and a deterioration degree diagnosis method for an electrical connection portion, which are capable of accurately diagnosing a deterioration degree of an electrical connection portion between two metal members.

The present invention is briefly described as above. Details of the present invention are further clarified by reading through a mode described below for implementing the invention (hereinafter, referred to as an "embodiment") with reference to accompanying drawings.

DESCRIPTION OF EMBODIMENTS

Embodiment

Figure 1:
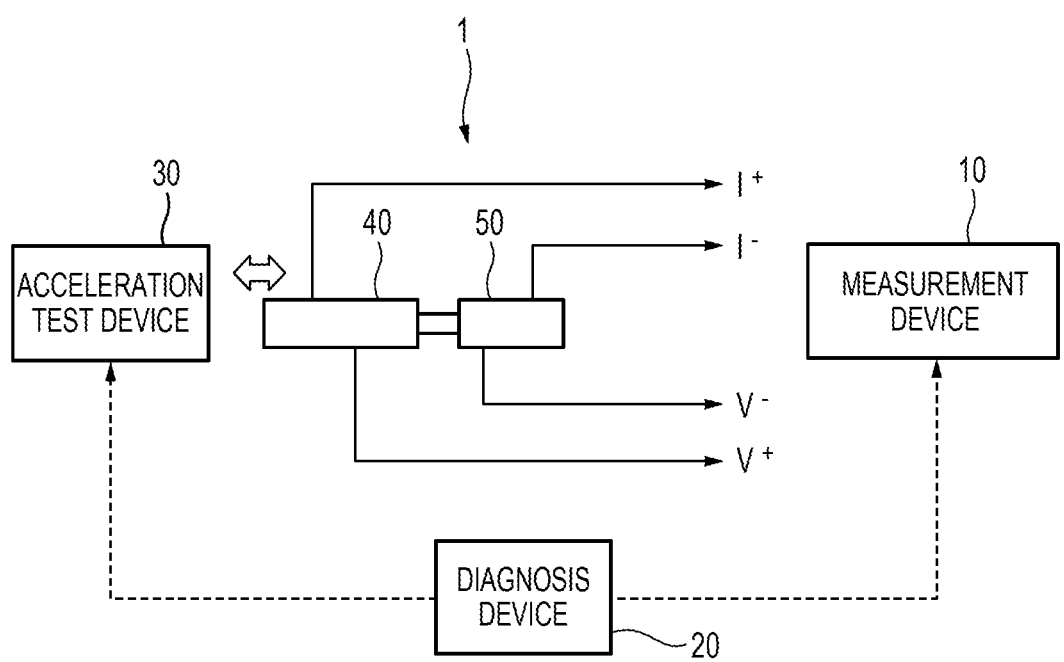
FIG. 1 is a schematic view illustrating a deterioration degree diagnosis device according to an embodiment of the present invention.

Hereinafter, a deterioration degree diagnosis device 1 according to an embodiment of the present invention is described with reference to the drawings. As illustrated in FIG. 1, the degradation degree diagnosis device 1 includes a measurement device 10, a diagnosis device 20, and an acceleration test device 30. The deterioration degree diagnosis device 1 is a device that is configured to diagnose a deterioration degree of an electrical connection portion of two metal members 40, 50 in contact via an electrical connection portion.

Figure 2:
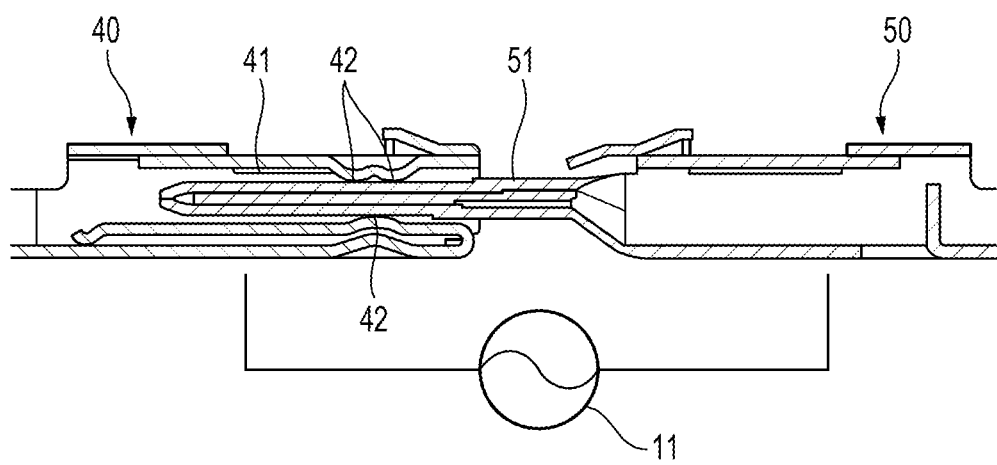
FIG. 2 is a view illustrating an example of an electric circuit that connects two metal members.

Hereinafter, in describing the deterioration degree diagnosis device 1, as illustrated in FIG. 2, a female terminal 40 and a male terminal 50 of the connector are used as an example of the two metal members 40, 50. As illustrated in FIG. 2, in a state where a tab 51 of the male terminal 50 is inserted into a tab receiving portion 41 of the female terminal 40, the female terminal 40 and the male terminal 50 are electrically connected by contacting a protruding portion 42 protruding inward from a predetermined position on an inner peripheral surface of the tab receiving portion 41 with a side surface of the tab 51. That is, a position at which the protruding portion 42 of the female terminal 40 and the side surface of the tab 51 of the male terminal 50 contact each other forms the electrical connection portion of the female terminal 40 and the male terminal 50.

Both the female terminal 40 and the male terminal 50 are shaped by a predetermined pressing, bending or the like of a plate-shape base material made of copper alloy, and are formed by performing tin plating on a surface of the shaped base material made of copper alloy. Therefore, in the new female terminal 40 and the male terminal 50, a tin-plated layer of the female terminal 40 and a tin-plated layer of the male terminal 50 are in contact with each other at the electrical connection portion.

When an AC signal of a predetermined frequency is applied to an electric circuit by an AC power supply 11 interposed in the electric circuit connecting the female terminal 40 and the male terminal 50 as illustrated in FIG. 2, the measurement device 10 measures an AC voltage (AC voltage between V+ and V−) between the female terminal 40 and the male terminal 50 and an AC current (AC current flowing between I+ and I−) flowing between the female terminal 40 and the male terminal 50 using a four-terminal measurement method as illustrated in FIG. 1 to measure impedance (resistance component+reactance component) related to contact resistance of the electrical connection portion.

The diagnosis device 20 is configured to diagnose a deterioration degree of the electrical connection portion between the female terminal 40 and the male terminal 50 based on a reactance component value in the impedance measured by the measurement device 10.

Hereinafter, two types of preliminary tests performed so as to obtain a relationship between the deterioration degree of the electrical connection portion between the female terminal 40 and the male terminal 50 and a contact resistance value (electrical resistance value measured using a DC signal) of the electrical connection portion are described as preparation for describing such operation of the measurement device 10 and the diagnosis device 20.

First, the first preliminary test is described. In the first preliminary test, when a DC power supply is interposed instead of the AC power supply 11 in the electric circuit illustrated in FIG. 2 and a predetermined DC signal is applied to the electric circuit by the DC power supply, the measurement device 10 measures a DC voltage (DC voltage between V+ and V−) between the female terminal 40 and the male terminal 50 and a DC current (DC current flowing between P+ and I−) flowing between the female terminal 40 and the male terminal 50 to measure the contact resistance value (electric resistance value measured using the DC signal) of the electrical connection portion.

Various samples with different deterioration degrees of the electrical connection portion are prepared as the female terminal 40 and the male terminal 50 to be measured by the measuring device 10. The acceleration test device 30 is used so as to prepare the various samples of the female terminal 40 and the male terminal 50 with different deterioration degrees of the electrical connection portion.

The acceleration test device 30 is configured to perform an acceleration test for accelerating a deterioration of the electrical connection portion between the female terminal 40 and the male terminal 50. In the acceleration test, one of the female terminal 40 and the male terminal 50, which are in contact with each other via the electrical connection portion, is slightly vibrated once per second with respect to another of the female terminal 40 and the male terminal 50 at a predetermined minute amplitude (for example, 50 µm) in an axial direction (fitting direction). In this acceleration test, a deterioration degree of the electrical connection portion between the female terminal 40 and the male terminal 50 is larger as a number of times of micro-vibrations is larger.

In the first preliminary test, various samples of the female terminal 40 and the male terminal 50 with different number of times of micro-vibrations by the acceleration test device 30 are prepared. In order to obtain a relationship between a number of times of micro-vibrations by the acceleration test device 30 and the contact resistance value (electrical resistance value measured using the DC signal) of the electrical connection portion, for each sample, the contact resistance value (electrical resistance value measured using the DC signal) of the electrical connection portion is measured using the measurement device 10 using the DC power supply as described above. Measurement results are shown in FIG. 3.

Figure 3:
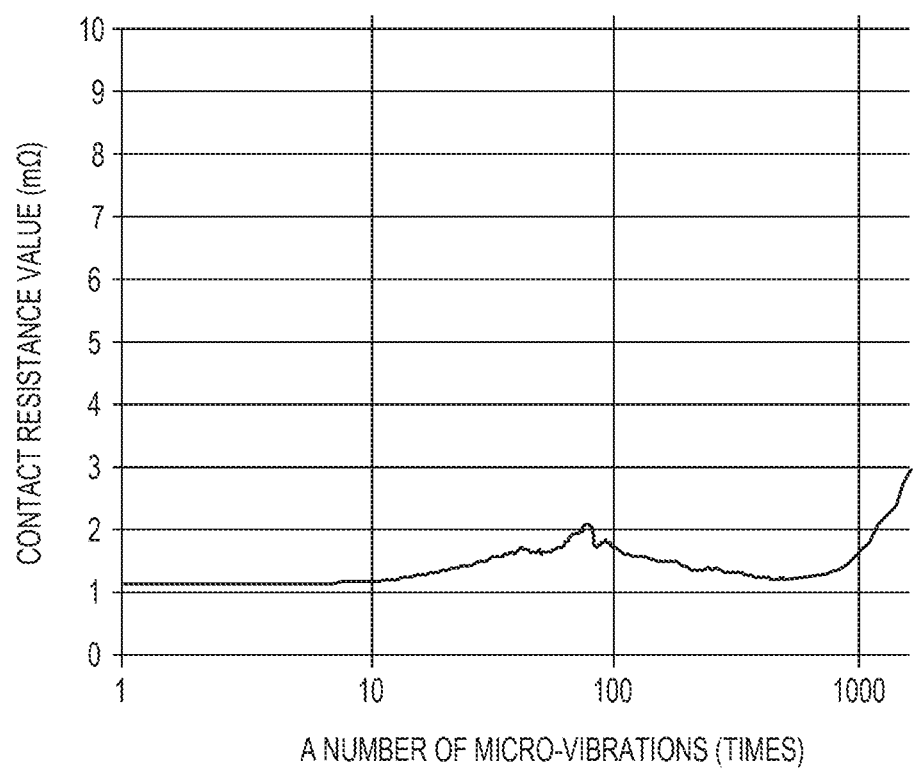
FIG. 3 is a graph showing an example of a relationship between a number of micro-vibrations by an acceleration test device and a contact resistance value (resistance component value) of the electrical connection portion when a DC signal is applied to the electric circuit by a DC power supply as a comparative example.

As can be understood from FIG. 3, the contact resistance value of the electrical connection portion is substantially maintained at an initial value (value when the number of times of micro-vibrations is zero) when the number of times of micro-vibrations is from zero to about 10. Thereafter, the contact resistance value gradually rises as the number of times of micro-vibrations increases up to about 100, and the contact resistance value reaches once a peak when the number of times of micro-vibrations is about 100. Thereafter, the contact resistance value gradually decreases as the number of times of micro-vibrations increases up to about several hundred. Thereafter, the contact resistance value rapidly increases, so that the electrical connection portion approaches an insulated state.

Here, it is considered that when the number of times of micro-vibrations is from about 10 to about 100, the contact resistance value of the electrical connection portion increases due to an increase in an amount of tin oxide generated in a vicinity of the electrical connection portion in the tin-plated layer in the vicinity of the electrical connection portion that is gradually scraped by the micro-vibrations and a decrease in an area of a newly formed surface of tin. It is considered that when the contact resistance value of the electrical connection portion reaches the peak, the tin-plated layer disappears and the copper alloy base material starts to be exposed in the vicinity of the electrical connection portion. It is considered that when the number of times of micro-vibrations is from about 100 to about several hundred, the contact resistance value of the electrical connection portion decreases due to an increase in an area of a newly formed surface of the copper alloy base material in the vicinity of the electrical connection portion that is gradually scraped by the micro-vibrations. It is considered that when the number of times of micro-vibrations is several hundred or more, the contact resistance value of the electrical connection portion increases due to an increase in an amount of oxide of copper alloy generated in the vicinity of the electrical connection portion in the copper alloy base material in the vicinity of the electrical connection portion that is gradually scraped by the micro-vibrations and a decrease in the area of the newly formed surface of the copper alloy base material.

As shown in FIG. 3, the contact resistance (electrical resistance value measured using the DC signal) of the electrical connection portion generally increases with an increase in the number of times of micro-vibrations by the acceleration test device 30 (that is, with progress of the deterioration degree of the electrical connection portion or with progress of an oxidation reaction in the vicinity of the electrical connection portion), while an increase tendency thereof is not monotonic increase. Therefore, it is difficult to accurately diagnose the deterioration degree of the electrical connection portion based on the contact resistance value of the electrical connection portion. The first preliminary test has been described above.

Next, the second preliminary test is described. In the second preliminary test, when the AC signal of a predetermined frequency is applied to the electric circuit by the AC power supply 11 interposed in the electric circuit as illustrated in FIG. 2, the measurement device 10 measures the AC voltage (AC voltage between V+ and V−) between the female terminal 40 and the male terminal 50 and an AC current (AC current flowing between I+ and I−) flowing between the female terminal 40 and the male terminal 50 using the four-terminal measurement method as illustrated in FIG. 1 to measure the impedance (resistance component+ reactance component) related to the contact resistance of the electrical connection portion. 2 MHz was adopted as the predetermined frequency.

Figure 4:
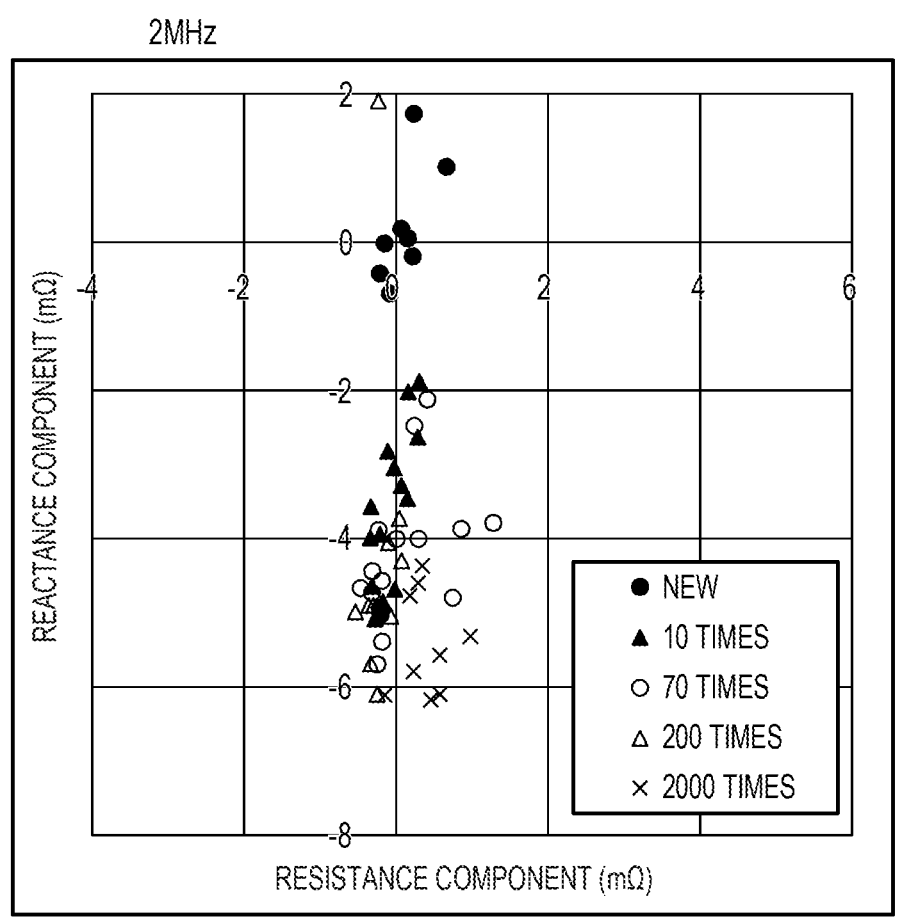
FIG. 4 is a graph showing an example of the relationship between the number of micro-vibrations by the acceleration test device and impedance (resistance component+reactance component) related to the contact resistance of the electrical connection portion when an AC signal of 2 MHz is applied to the electric circuit by an AC power supply.
Figure 5:
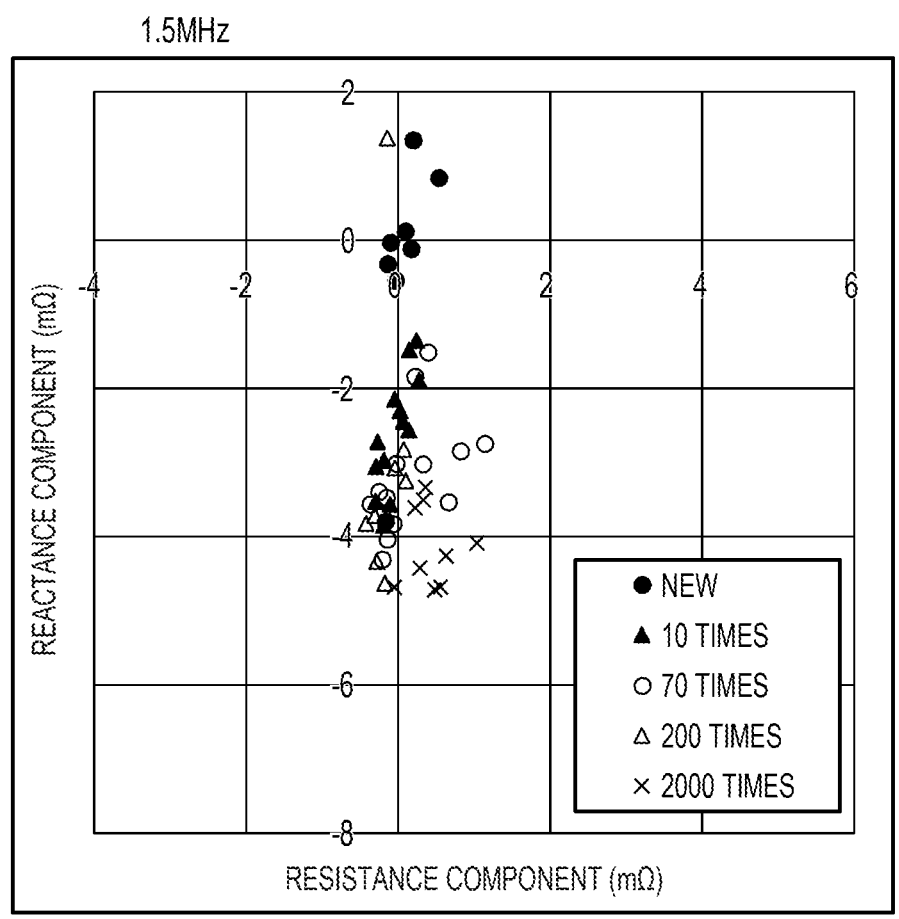
FIG. 5 is a graph showing an example of the relationship between the number of micro-vibrations by the acceleration test device and the impedance (resistance component+reactance component) related to the contact resistance of the electrical connection portion when an AC signal of 1.5 MHz is applied to the electric circuit by the AC power supply.
Figure 6:
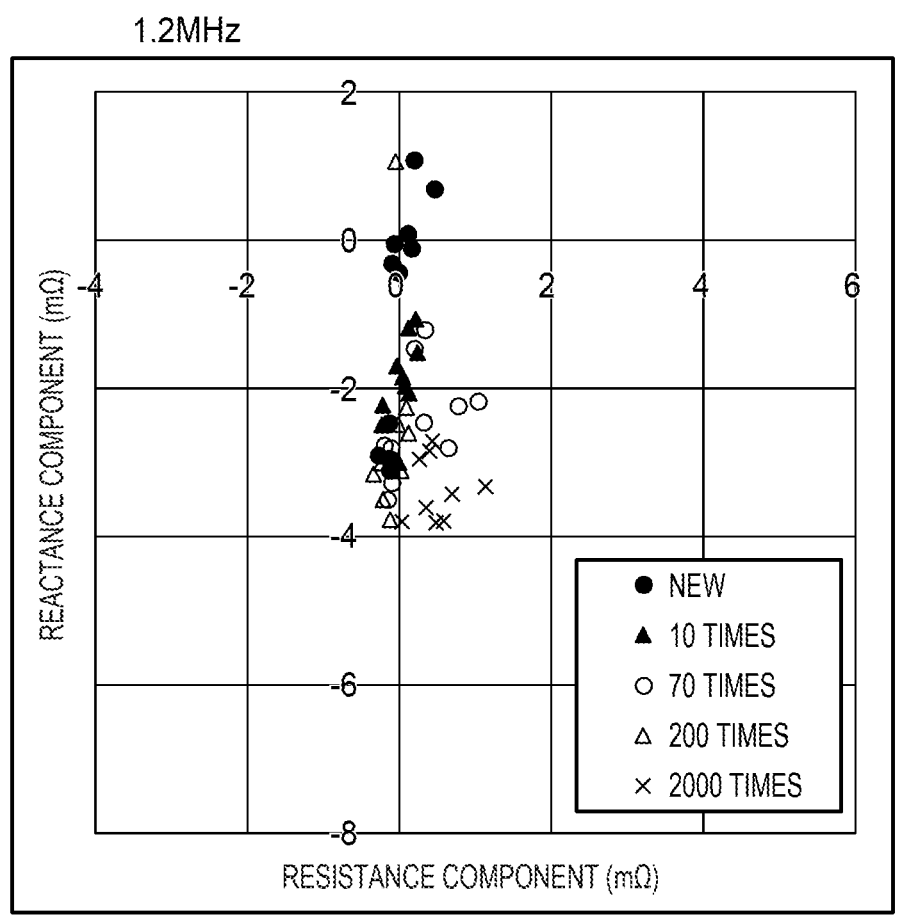
FIG. 6 is a graph showing an example of the relationship between the number of micro-vibrations by the acceleration test device and the impedance (resistance component+reactance component) related to the contact resistance of the electrical connection portion when an AC signal of 1.2 MHz is applied to the electric circuit by the AC power supply.
Figure 7:
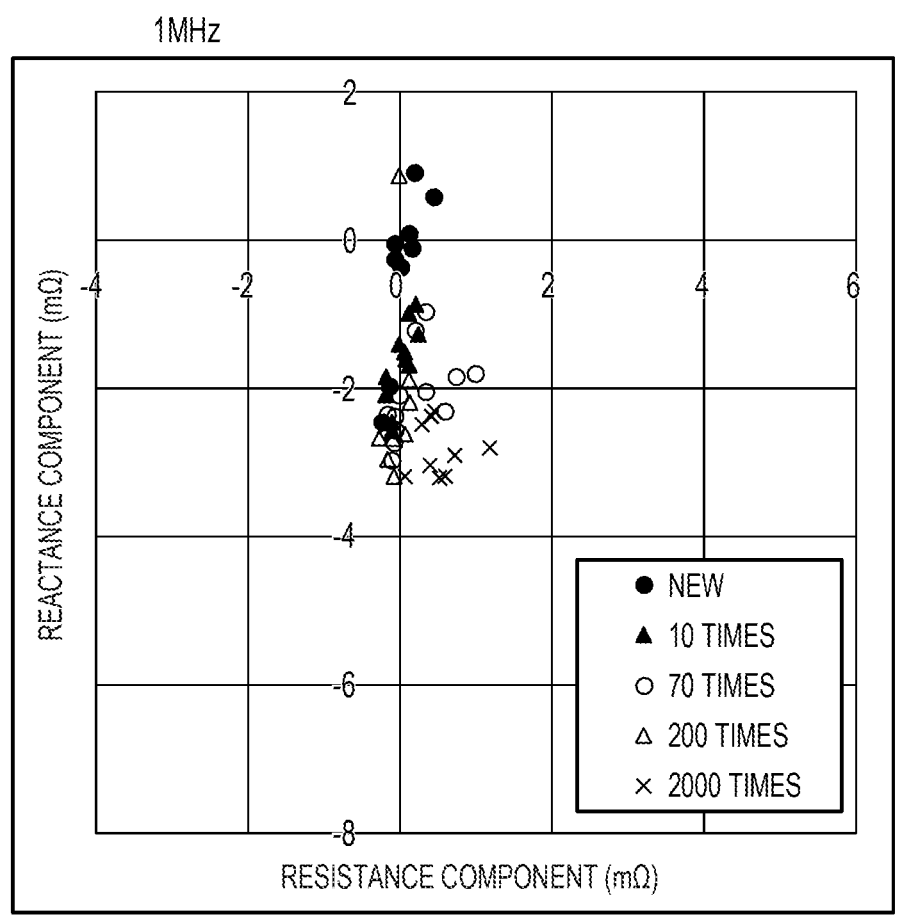
FIG. 7 is a graph showing an example of the relationship between the number of micro-vibrations by the acceleration test device and the impedance (resistance component+reactance component) related to the contact resistance of the electrical connection portion when an AC signal of 1.0 MHz is applied to the electric circuit by the AC power supply.
Figure 8:
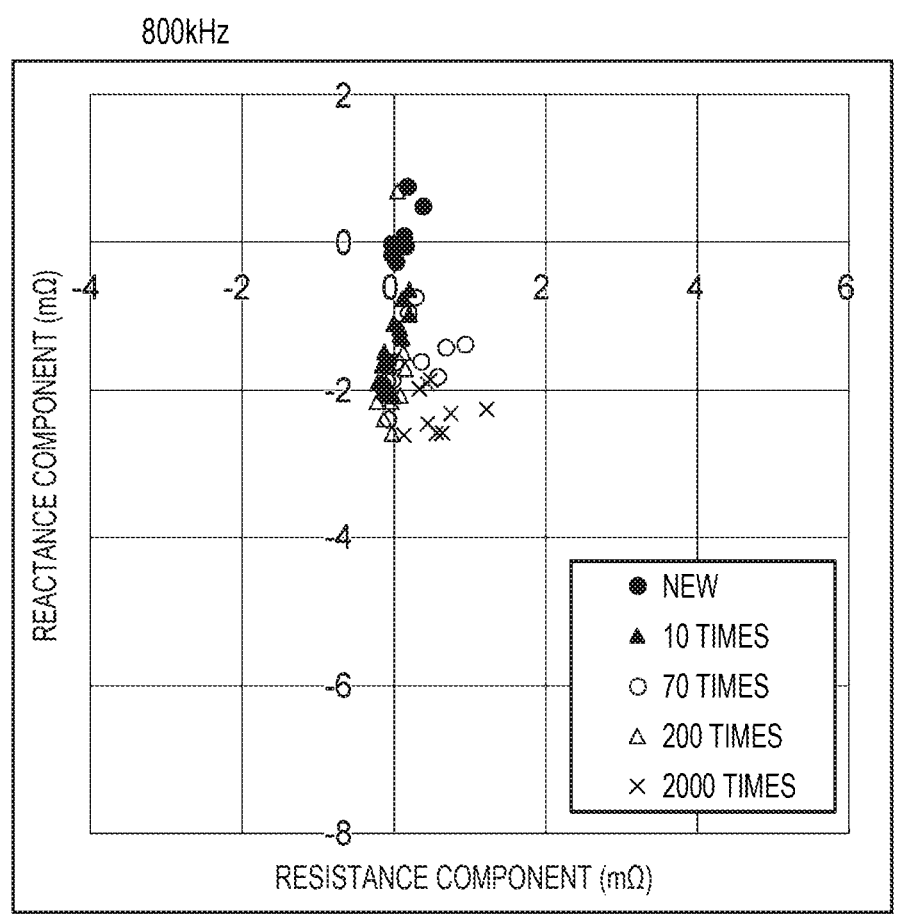
FIG. 8 is a graph showing an example of the relationship between the number of micro-vibrations by the acceleration test device and the impedance (resistance component+reactance component) related to the contact resistance of the electrical connection portion when an AC signal of 800 kHz is applied to the electric circuit by the AC power supply.
Figure 9:
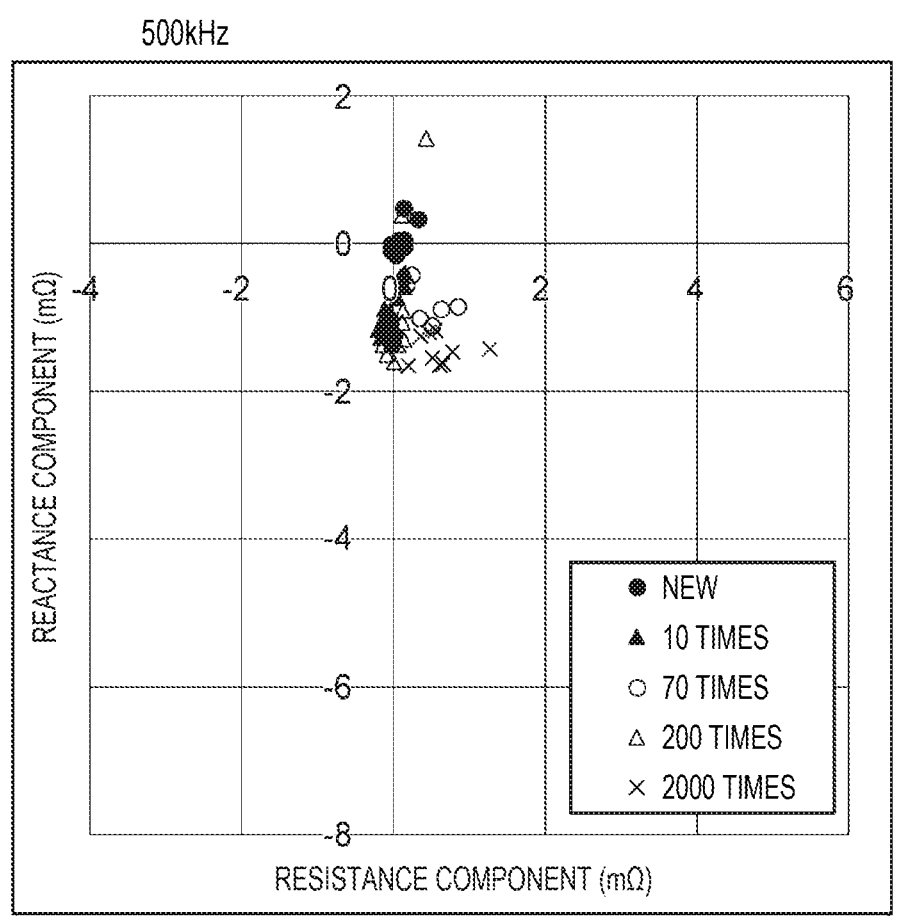
FIG. 9 is a graph showing an example of the relationship between the number of micro-vibrations by the acceleration test device and the impedance (resistance component+reactance component) related to the contact resistance of the electrical connection portion when an AC signal of 500 kHz is applied to the electric circuit by the AC power supply.
Figure 10:
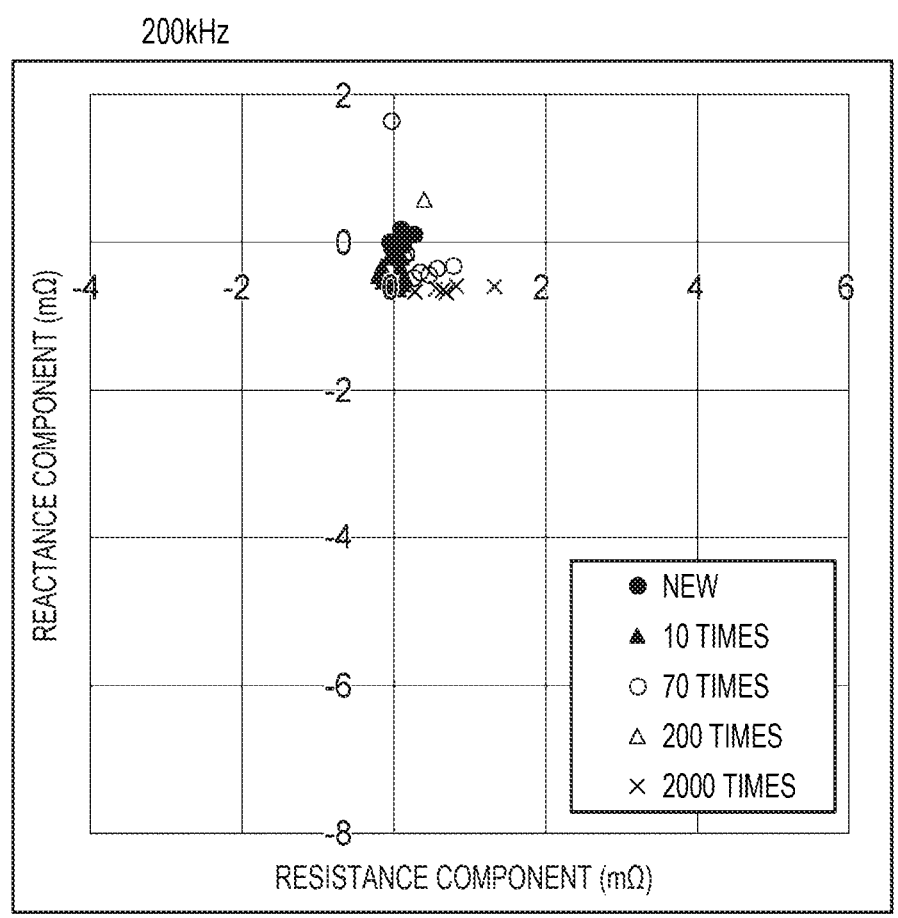
FIG. 10 is a graph showing an example of the relationship between the number of micro-vibrations by the acceleration test device and the impedance (resistance component+reactance component) related to the contact resistance of the electrical connection portion when an AC signal of 200 kHz is applied to the electric circuit by the AC power supply.
Figure 11:
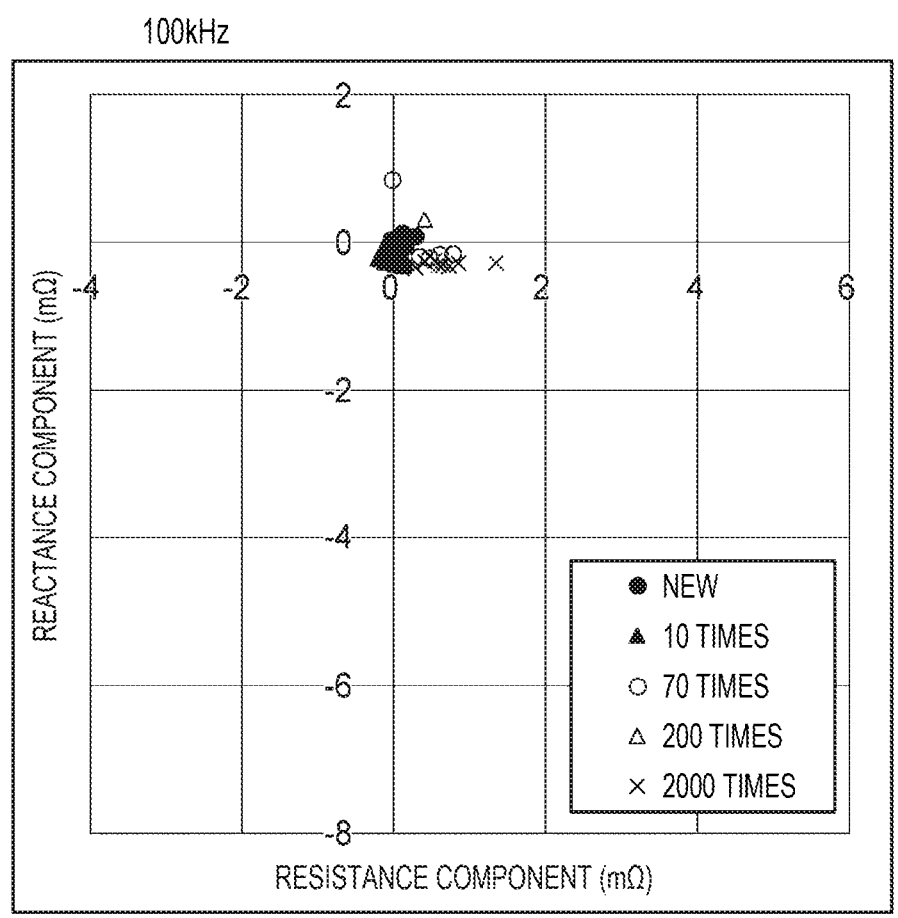
FIG. 11 is a graph showing an example of the relationship between the number of micro-vibrations by the acceleration test device and the impedance (resistance component+reactance component) related to the contact resistance of the electrical connection portion when an AC signal of 100 kHz is applied to the electric circuit by the AC power supply.
Figure 12:
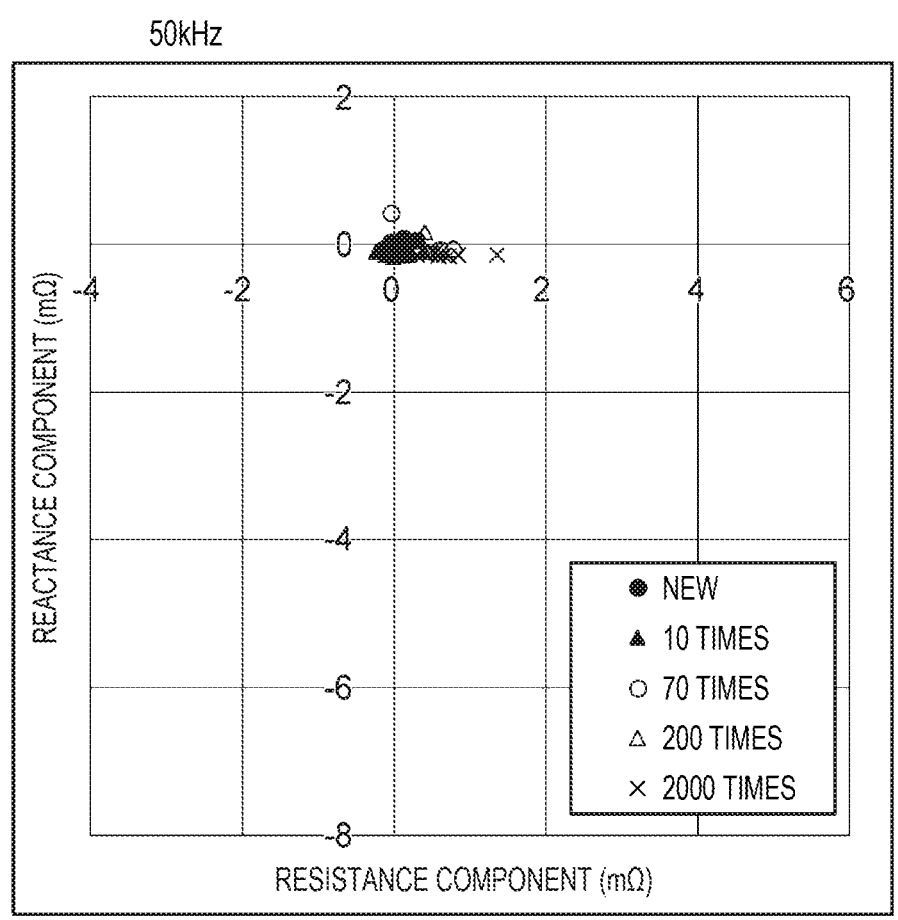
FIG. 12 is a graph showing an example of the relationship between the number of micro-vibrations by the acceleration test device and the impedance (resistance component+reactance component) related to the contact resistance of the electrical connection portion when an AC signal of 50 kHz is applied to the electric circuit by the AC power supply.
Figure 13:
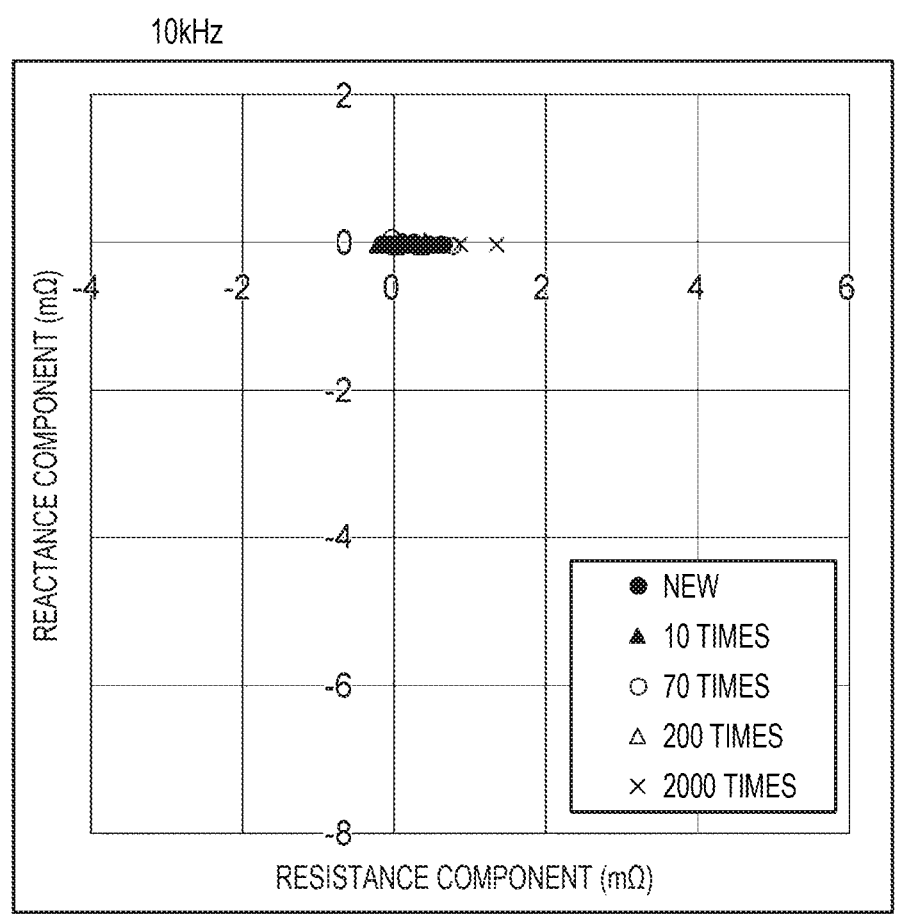
FIG. 13 is a graph showing an example of the relationship between the number of micro-vibrations by the acceleration test device and the impedance (resistance component+reactance component) related to the contact resistance of the electrical connection portion when an AC signal of 10 kHz is applied to the electric circuit by the AC power supply.
Figure 14:
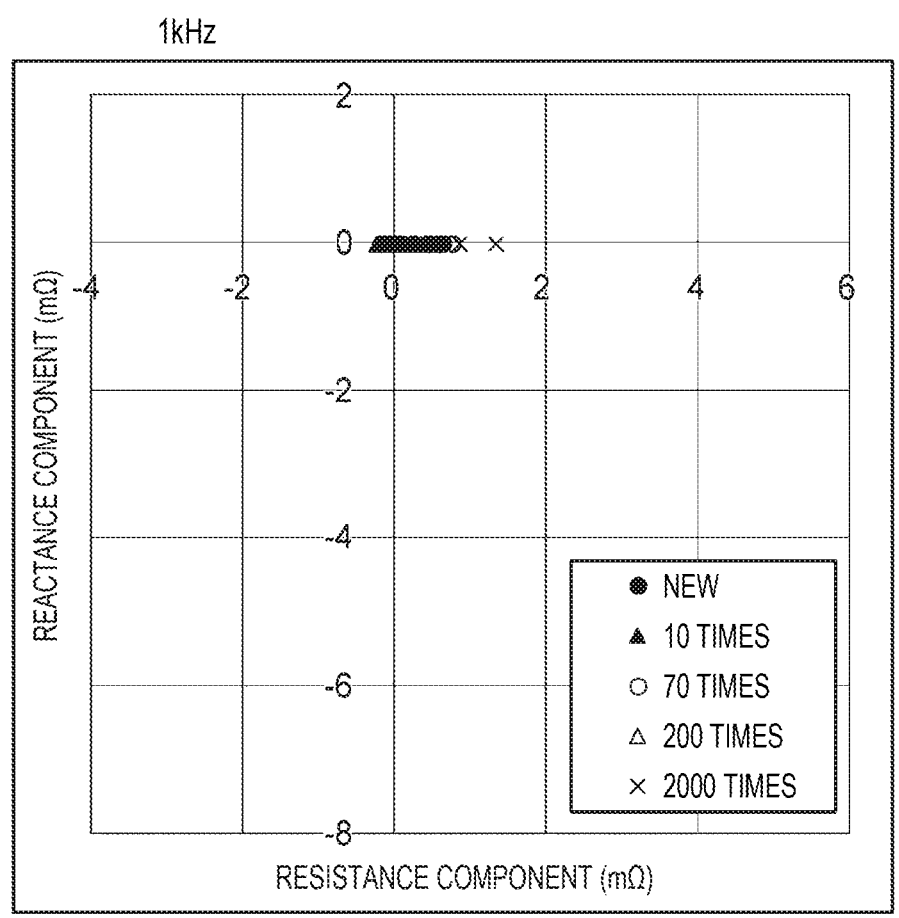
FIG. 14 is a graph showing an example of the relationship between the number of micro-vibrations by the acceleration test device and the impedance (resistance component+reactance component) related to the contact resistance of the electrical connection portion when an AC signal of 1 kHz is applied to the electric circuit by the AC power supply.

Similarly to the first preliminary test, in the second preliminary test, various samples of the female terminal 40 and the male terminal 50 with different number of times of micro-vibrations by the acceleration test device 30 are prepared. Specifically, samples with the number of times of micro-vibrations of zero (that is, the new female terminal 40 and the new male terminal 50), 10, 70, 200 and 2000 are each prepared for 10. In order to obtain the relationship between the number of times of micro-vibrations by the acceleration test device 30 and the impedance (resistance component+reactance component) related to the contact resistance of the electrical connection portion, for each sample, the impedance is measured using the measurement device 10 using the AC power supply 11 with a frequency of 2 MHz as described above. Measurement results are shown in FIG. 4. In FIG. 4, a horizontal axis corresponds to the resistance component (real number component) of the impedance and a vertical axis corresponds to the reactance component (imaginary number component) of the impedance.

As can be understood from FIG. 4, the resistance component is almost irrelevant to the number of times of micro-vibrations (that is, the deterioration degree of the electrical connection portion or a progress degree of the oxidation reaction in the vicinity of the electrical connection portion) by the acceleration test device 30. On the other hand, the reactance component gradually separates (thus, (absolute value of) deviation of the reactance component value from the initial value monotonously increases) in one direction (more specifically; in a negative direction) from the initial value (value when female terminal 40 and male terminal 50 are new) with the increase in the number of times of micro-vibrations by the acceleration test device 30

(that is, with the progress of the deterioration degree of the electrical connection portion or with the progress of the oxidation reaction in the vicinity of the electrical connection portion). In other words, the deviation of the reactance component value from the initial value monotonously increases with the progress of the deterioration degree of the electrical connection portion. As a result, using this deviation, the deterioration degree of the electrical connection portion can be diagnosed such that the deterioration degree of the electrical connection portion increases as the deviation of the reactance component value from the initial value increases.

A reason of this result is considered to be a fact that a degree, to which electrostatic capacitance of the metal oxide (more specifically, oxide of each of the tin plating and the copper alloy base material) having a high dielectric constant generated in the vicinity of the electrical connection portion is added in the vicinity of the electrical connection portion, monotonically increases with the progress of the oxidation reaction in the vicinity of the electrical connection portion so that the reactance component (more specifically, the capacitive reactance component) changes in one direction. That is, it is considered that the reactance component value can accurately represent the structural change degree (degree to which the electrostatic capacitance due to the metal oxide is added) in the vicinity of the electrical connection portion with the progress of the deterioration degree of the electrical connection portion.

Based on the above findings, in the deterioration degree diagnosis device 1 shown in FIG. 1, the diagnosis device 20 stores the reactance component value in the impedance measured in advance by the measurement device 10 for the two new metal members 40, 50 as the initial value. Further, the diagnosis device 20 stores "a correlation between the deterioration degree of the electrical connection portion and the deviation of the reactance component value from the initial value" obtained from a result shown in FIG. 4.

Then, the diagnosis device 20 is configured to obtain the deviation between the reactance component value in the impedance measured this time by the measurement device 10 for the two metal members 40, 50 to be measured and the stored initial value to diagnose (determine) the deterioration degree of the electrical connection portion based on the deviation and the correlation. As a result, the degradation degree of the electrical connection portion is diagnosed such that the deterioration degree of the electrical connection portion increases as the deviation increases. The two metal members 40, 50 that can be measured are limited to the two metal members 40, 50 used for the measurement of the initial value and the correlation stored in the diagnosis device 20 and those having the same shape and material as the two metal members 40, 50.

Hereinafter, the frequency of the AC power supply 11 used by the measurement device 10 is described. The inventor of the present invention repeatedly performs an additional test with the same contents as the above-described second preliminary test while changing the frequency of the AC power supply 11 to a frequency different from 2 MHz. Specifically, the additional test is performed at 1.5 MHz, 1.2 MHz, 1 MHz, 800 kHz, 500 kHz, 200 kHz, 100 kHz, 50 kHz, 10 kHz and 1 kHz. These results are shown in FIGS. 5 to 14.

As can be understood from FIGS. 4 to 14, an increase gradient of the "deviation of the reactance component value from the initial value", which increases as the deterioration degree of the electrical connection portion increases from zero, is larger as the frequency of the AC signal applied to the electric circuit increases.

Accordingly, for example, as described above, when a sufficiently large frequency of 500 kHz to 2 MHz is adopted as the frequency of the AC signal applied to the electric circuit, as shown in FIG. 4, the increase gradient of the "deviation of the reactance component value from the initial value" with the progress of the deterioration degree of the electrical connection portion becomes sufficiently large. Therefore, it is possible to use a device with a sufficiently large measurement range (in other words, the device that is less likely to be affected by noise) as the measurement device 10. In other words, even in an environment where noise is relatively large, the reactance component value can be accurately measured, and thus the deterioration degree of the electrical connection portion can be accurately diagnosed.

On the contrary, when the measurement device 10 is disposed in an environment where noise is relatively small, a device with a relatively small measurement range (in other words, the device that is likely to be affected by noise) can be used as the measurement device 10. As described above, the frequency of the AC signal applied to the electric circuit can be appropriately determined to an optimal value based on the measurement range of the measurement device 10 and an amount of noise in the environment in which the measurement device 10 is disposed.

According to the deterioration degree diagnosis device 1 and the deterioration degree diagnosis method thereof according to the embodiment of the present invention, by using a strong correlation (see FIG. 4) between the reactance component (imaginary component) value in the impedance (complex number) related to the contact resistance of the electrical connection portion measured using the AC signal of the predetermined frequency and the deterioration degree of the electrical connection portion, it is possible to accurately diagnose the deterioration degree of the electrical connection portion between the two metal members 40, 50 based on the correlation and the reactance component value.

Other Embodiments

The present invention is not limited to the above embodiment, and various modifications can be adopted within the scope of the present invention. For example, the present invention is not limited to the above-described embodiment, and can be appropriately modified, improved or the like. In addition, a material, a shape, a size, a number, an arrangement position or the like of each constituent element in the above-described embodiment are optional as long as the present invention can be achieved, and the present invention is not limited thereto.

In the above embodiment, the female terminal 40 and the male terminal 50 in which tin plating is applied on the surface of the copper alloy base material are adopted as the two metal members 40, 50. However, it is separately known that a correlation that is the same as the correlation shown in FIG. 4 can be obtained even in the case where the female terminal 40 and the male terminal 50 in which plating different from tin plating is applied on a surface of a metal base material different from the copper alloy base material are adopted as the two metal members 40, 50, or even in the case where the female terminal 40 and the male terminal 50 in which no plated layer is formed on the surface of the metal base material are adopted as the two metal members 40, 50. Typical examples of the metal base material include copper, aluminum and an aluminum alloy in addition to the copper alloy. Typical examples of the plating include base metal plating including tin plating. Therefore, the present invention can also be applied to the metal members 40, 50 having these configurations.

Further, in the above embodiment, the female terminal 40 and the male terminal 50 of the connector are adopted as the two metal members 40, 50. However, any type of metal members 40, 50, which are electrical connection portions between an end portion of an electric wire and a terminal or the like, may be adopted as long as they have a structure electrically connected via an electrical connection portion. Further, the two metal members 40, 50 may be members that are mounted on a vehicle or may be members that are not mounted on a vehicle.

Further, in the above embodiment, the measurement device 10 measures the impedance by using the four-terminal measurement method. However, it is needless to say that the measurement device 10 may measure the impedance by using a two-terminal measurement method.

Here, characteristics of the deterioration degree diagnosis device 1 and the deterioration degree diagnosis method according to the present invention are briefly summarized and listed in the following items (1) to (5).

(1) A deterioration degree diagnosis device (1) which diagnoses a deterioration degree of an electrical connection portion between two metal members, the deterioration degree diagnosis device includes:
  a measurement unit (10) that is configured to measure an impedance related to a contact resistance of the electrical connection portion by measuring an AC voltage between the metal members (40, 50) and an AC current flowing between the metal members (40, 50) in a state where an AC signal of a predetermined frequency is applied to an electric circuit that connects the two metal members (40, 50) in contact via the electrical connection portion; and
  a diagnosis unit (20) that is configured to diagnose a deterioration degree of the electrical connection portion based on a reactance component value in the impedance measured by the measurement unit (10).

(2) In the deterioration degree diagnosis device (1) according to (1),
  the diagnosis unit (20) stores, as an initial value, the reactance component value in the impedance measured in advance by the measurement unit (10) for the two new metal members (40, 50), and
  the diagnosis unit (20) is configured to diagnose the deterioration degree of the electrical connection portion such that the deterioration degree of the electrical connection portion increases as a deviation of the reactance component value from the initial value increases.

(3) In the deterioration degree diagnosis device (1) according to (1) or (2), the metal member (40, 50) is formed of a plated metal base material.

(4) In the deterioration degree diagnosis device (1) according to any one of (1) to (3), the predetermined frequency is 500 kHz to 2 MHz.

(5) A deterioration degree diagnosis method which diagnoses a deterioration degree of an electrical connection portion between two metal members, the deterioration degree diagnosis method includes:

a measurement step of measuring an impedance related to a contact resistance of the electrical connection portion by measuring an AC voltage between the metal members (40, 50) and an AC current flowing between the metal members (40, 50) in a state where an AC signal of a predetermined frequency is applied to an electric circuit that connects the two metal members (40, 50) in contact via the electrical connection portion; and
  a diagnosis step of diagnosing a deterioration degree of the electrical connection portion based on a reactance component value in the impedance measured by the measurement step.

What is claimed is:

1. A deterioration degree diagnosis device which diagnoses a deterioration degree of an electrical connection portion between two metal members, the deterioration degree diagnosis device comprising:
  a measurement unit that is configured to measure an impedance related to a contact resistance of the electrical connection portion by measuring an AC voltage between the metal members and an AC current flowing between the metal members in a state where an AC signal of a predetermined frequency is applied to an electric circuit that connects the two metal members in contact via the electrical connection portion; and
  a diagnosis unit that is configured to diagnose a deterioration degree of the electrical connection portion based on a reactance component value in the impedance measured by the measurement unit.

2. The deterioration degree diagnosis device according to claim 1,
  wherein the diagnosis unit stores, as an initial value, the reactance component value in the impedance measured in advance by the measurement unit for the two new metal members, and
  the diagnosis unit is configured to diagnose the deterioration degree of the electrical connection portion such that the deterioration degree of the electrical connection portion increases as a deviation of the reactance component value from the initial value increases.

3. The deterioration degree diagnosis device according to claim 1,
  wherein the metal member is formed of a plated metal base material.

4. The deterioration degree diagnosis device according to claim 1,
  wherein the predetermined frequency is 500 kHz to 2 MHz.

5. A deterioration degree diagnosis method which diagnoses a deterioration degree of an electrical connection portion between two metal members, the deterioration degree diagnosis method comprising:
  a measurement step of measuring an impedance related to a contact resistance of the electrical connection portion by measuring an AC voltage between the metal members and an AC current flowing between the metal members in a state where an AC signal of a predetermined frequency is applied to an electric circuit that connects the two metal members in contact via the electrical connection portion; and
  a diagnosis step of diagnosing a deterioration degree of the electrical connection portion based on a reactance component value in the impedance measured by the measurement step.

* * * * *